United States Patent
Seiz et al.

(10) Patent No.: US 11,137,512 B2
(45) Date of Patent: Oct. 5, 2021

(54) METHOD FOR OPERATING A SENSOR SYSTEM, SENSOR ELEMENT AND SENSOR SYSTEM

(71) Applicant: Robert Bosch GmbH, Stuttgart (DE)

(72) Inventors: Daniel Seiz, Magstadt (DE); Joachim Frangen, Heilbronn (DE)

(73) Assignee: Robert Bosch GmbH, Stuttgart (DE)

( * ) Notice: Subject to any disclaimer, the term of this patent is extended or adjusted under 35 U.S.C. 154(b) by 727 days.

(21) Appl. No.: 16/062,770

(22) PCT Filed: Oct. 26, 2016

(86) PCT No.: PCT/EP2016/075800
§ 371 (c)(1),
(2) Date: Jun. 15, 2018

(87) PCT Pub. No.: WO2017/108235
PCT Pub. Date: Jun. 29, 2017

(65) Prior Publication Data
US 2021/0199834 A1     Jul. 1, 2021

(30) Foreign Application Priority Data
Dec. 21, 2015 (DE) .......................... 102015226129.8

(51) Int. Cl.
*G01V 3/08* (2006.01)
*H03K 17/955* (2006.01)

(52) U.S. Cl.
CPC ........... *G01V 3/088* (2013.01); *H03K 17/955* (2013.01); *H03K 2217/945* (2013.01)

(58) Field of Classification Search
None
See application file for complete search history.

(56) References Cited

U.S. PATENT DOCUMENTS 5,914,610 A * 6/1999 Gershenfeld .......... G01V 3/088
324/663
2003/0021078 A1   1/2003 van Berkel
(Continued)

FOREIGN PATENT DOCUMENTS

CN          1217835 A      5/1999
CN       103528604 A      1/2014
(Continued)

OTHER PUBLICATIONS

International Search Report for PCT/EP2016/075800, dated Feb. 3, 2017.

(Continued)

*Primary Examiner* — Jas A Sanghera
(74) *Attorney, Agent, or Firm* — Norton Rose Fulbright US LLP; Gerard Messina

(57) ABSTRACT

A method for operating a sensor system having at least three sensor elements that can be attached on the surface of machines or components, the sensor elements having electrodes for forming electrical fields between electrodes having different electrical potential, the electrical fields changing upon the approach and/or contact of a body or an object, the electrodes acting as transmit electrode and/or as receive electrode, and the sensor elements being controlled in succession by a control device in a particular temporal or positional sequence.

12 Claims, 3 Drawing Sheets

(56) References Cited

U.S. PATENT DOCUMENTS

| | | | |
|---|---|---|---|
| 2007/0109274 A1 | 5/2007 | Reynolds | |
| 2013/0262004 A1 | 10/2013 | Hargreaves | |
| 2015/0227229 A1 | 8/2015 | Schwartz et al. | |
| 2018/0116545 A1* | 5/2018 | Hwang | A61B 5/7225 |

FOREIGN PATENT DOCUMENTS

| | | |
|---|---|---|
| DE | 102009029021 A1 | 3/2011 |
| DE | 102010064328 A1 | 7/2012 |
| WO | 2015046058 A1 | 4/2015 |

OTHER PUBLICATIONS

Hasegawa, et al.: "Net-Structure Proximity Sensor: High-Speed and Free-Form Sensor with Analog Computing Circuit", IEEE/ASME Transactions on Mechatronics, 20(6), (2015), pp. 3232-3241.

* cited by examiner

METHOD FOR OPERATING A SENSOR SYSTEM, SENSOR ELEMENT AND SENSOR SYSTEM

FIELD

The present invention relates to a method for operating a sensor system. In addition, the present invention relates to a sensor element and a sensor system for carrying out the method.

BACKGROUND INFORMATION

A method for operating a sensor system and a sensor system that operates according to such a method are described in, for example, German Patent Application No. DE 10 2009 029 021. The sensor system described therein includes at least one capacitive sensor element whose electrical field, produced by it, changes when coming closer to a body or an object, the change being capable of being acquired and evaluated. In particular in handling robots or similar machines or systems, when a human being or an object approaches a moving machine part, such as a robot arm, the conventional sensor system switches the machine to a safety mode in which the movement of the relevant machine part is stopped or at least slowed. In this way, in particular injuries, in the case of a collision of the handling device with a human being, or damage to objects or to the handling device, can be avoided or at least minimized. The conventional sensor system may include a multiplicity of sensor elements having a flat structure, which for example cover the entire surface of a handling device in the manner of a sensor skin, and are connected to one another by wiring.

German Patent Application No. DE 10 2009 029 021 also describes simultaneously analyzing two immediately adjacent sensor elements, or the electrical fields formed between the sensor elements, in order in this way for example to bridge gaps or the like that are present in a machine, and/or to increase the range of the sensor elements. Here, the electrical field formed between two sensor elements is also monitored or analyzed. It is also essential that the sensor elements described in German Patent Application No. DE 10 2009 029 021 always have two electrical potentials, i.e., that an electrical field can already be formed by a single sensor element.

German Patent Application No. DE 10 2010 064 328 A1 describes different central units simultaneously controlling or addressing two different sensor elements of a sensor system.

SUMMARY

An object of the present invention is to provide a method for operating a sensor system in such a way that, as a result, greater safety and/or a denser monitoring field are achieved relative to the existing art, and approaches between the sensor elements and a body or an object can be recognized particularly reliably and early.

According to the present invention, this object may be achieved by an example method for operating a sensor system described herein.

In accordance with the present invention, not only is the electrical field between two adjacent sensor elements monitored or evaluated, but also, in the extreme case, all electrical fields formed between a first sensor element acting as transmit electrode and all other second sensor elements acting as receive electrodes are monitored or evaluated. The method according to the present invention may be realized in such a way that simultaneously at least two electrical fields are formed between a first sensor element, acting as transmit electrode, and two second sensor elements acting as receive electrodes, or that the at least two simultaneously formed electrical fields are formed between two first sensor elements acting as transmit electrode and a second sensor element acting as receive electrode. Summarizing, in the method according to the present invention it is thus always the case that at least three sensor elements are simultaneously active, or involved in the production of electrical fields. Such a realization of the method therefore makes it possible to increase the range through the use or evaluation of a multiplicity of electrical fields, or to enable discovery of possible malfunctions of the sensor system through monitoring and comparison of the individual electrical fields. In the context of the present invention, a transmit electrode is understood as the application of an electrical alternating field to an electrode or electrode element. A receive electrode is understood as the measuring of electrical alternating fields at the electrode or electrode element.

Advantageous developments of the method according to the present invention for operating a sensor system are described herein.

In a first concrete development of the present invention, it is provided that all sensor elements not acting as transmit electrode are simultaneously switched as receive electrode. Such a realization of the method ensures a maximum range, or a recognition as early as possible of a possible collision risk, and accelerates the monitoring process through the simultaneous carrying out of a plurality of measurement processes. In addition, with knowledge of the configuration or position of the individual sensor elements acting as receive electrode, a possible nearing can for example be analyzed particularly easily with regard to a potential risk through acquisition of the changes in the individual electrical fields.

In order to achieve redundancy, i.e., in order to ensure or verify the analysis of individual electrical fields, in a further realization of the method according to the present invention it is in addition provided that at least two sensor elements, preferably situated immediately adjacent to one another, are switched in temporal succession as transmit electrode, and that the respective sensor element previously acting as transmit electrode is switched as receive electrode.

In a further embodiment of the present invention, which makes it possible to better determine a distance of a person or object from the sensor elements, measurement signals of electrical fields situated spatially close to one another are compared to measurement signals of electrical fields situated spatially far from one another, using an algorithm.

In a further advantageous embodiment of the method according to the present invention, which in particular enables larger ranges of the sensor system in areas having constructed interruptions (e.g., columns), it is provided that a plurality of sensor elements acting as receive electrode and/or a plurality of sensor elements acting as transmit electrode are electrically wired together.

Generally, a previously analyzed electrical field can be verified, or determined redundantly, independent of the distance between two sensor elements, i.e., even when further sensor elements are situated between the two sensor elements, if in a first step an electrical field formed between two sensor elements is produced by operating a first sensor element as transmit electrode and a second sensor element as receive electrode, and in a second step the electrical field is produced by operating the second sensor element as transmit electrode and the first sensor element as receive electrode.

A further advantageous realization of the method according to the present invention provides that, given a plurality of sensor elements, some electrical fields are formed simultaneously and other electrical fields are formed in temporal succession. In this way, for example regions of a machine or a robot can be divided into different relevant areas in such a way that for example areas that are moving with a relatively high speed (for example a grasping arm) can be evaluated differently with regard to the evaluation of the relevance for a possible collision than are areas of a robot (for example a stationary column area) for which it can be assumed that there is a low risk of collision. Here, the particularly relevant area is then monitored in particular by temporally simultaneously formed electrical fields.

While, as explained in the above segment, in the existing art a sensor element always has two electrical potentials or electrodes, in the context of the present invention it is possible, through simultaneous use of a plurality of sensor elements for the formation of electrical fields, to form a sensor element for carrying out the method according to the present invention in such a way that the sensor element has a single electrode for forming a part of an electrical field, the single electrode being capable of being connected to a different electrical potential in such a way that the single electrode optionally acts as receive electrode or as transmit electrode. Such a design of a sensor element can therefore be realized particularly easily or at low cost, so that additional savings in cost can be achieved in particular given a multiplicity of sensor elements, as is required given large machines or machine components to be monitored, in which the individual sensor elements are wired together in the form of a sensor skin.

For the effective and simple controlling of the individual sensor elements, the present invention also includes a sensor system in which a plurality of sensor elements are fashioned to be operated in accordance with the method of the present invention described above, the individual sensor elements being capable of being controlled by a common central unit via a bus system.

In particular, the sensor system described up to now is, preferably, part of a machine controlling for recognizing the approaching of objects or bodies. The machine controlling here can be realized such that when a potential risk of collision is recognized the machine controlling either puts the machine into a rest mode or into a safe mode in which a risk of collision is at least reduced.

Further advantages, features, and details of the present invention result from the description below of preferred exemplary embodiments, and on the basis of the figures.

DETAILED DESCRIPTION OF EXAMPLE EMBODIMENTS

Figure 1:
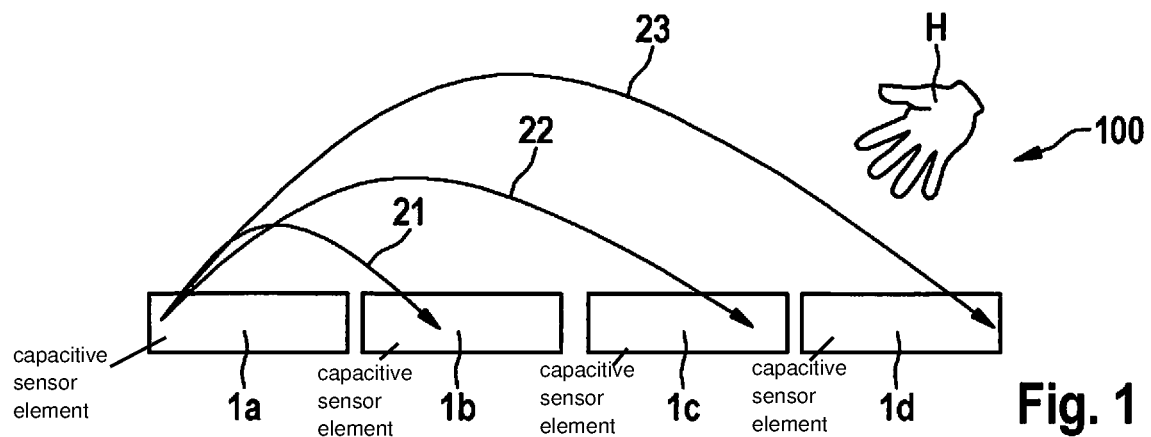
FIG. 1 through FIG. 4 show a sensor system made up of a plurality of sensor elements in which electrical fields are produced in temporal succession, in a simplified representation.

Identical elements, or elements having identical function, have been provided with identical reference characters in the Figures.

In FIGS. 1 through 4, as an example four capacitive sensor elements 1a through 1d situated adjacent to one another are shown in simplified fashion as part of a sensor system 100. In particular, it can be provided that sensor elements 1a through 1d are situated on a machine component or on a robot in the area of a movable component such as a gripper arm or the like. The situation of the individual sensor elements 1a through 1d can be done for example through adhesive bonding on the surface of the component. In addition, it is to be noted that, only as an example and for better clarity, four sensor elements 1a through 1d are shown. In practice, such a sensor system 100 will however have a large number of such sensor elements 1a through 1d, for example several hundred sensor elements 1a through 1d. The individual sensor elements 1a through 1d also do not necessarily have to be fashioned identically and/or have the same size.

In addition, a plurality of the sensor elements 1a through 1d can be constructively combined and for example situated on a common circuit bearer. Sensor elements 1a through 1d are thus functionally separate units that however do not necessarily have to be separated from one another in terms of their construction.

Figure 5:
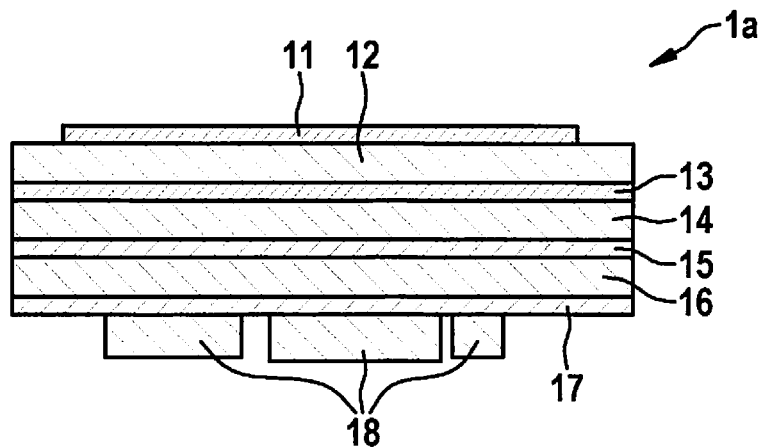
FIG. 5 shows a cross-section through a sensor element as used in the sensor system according to FIGS. 1 through 4.

With regard to the possible design of such a sensor element 1a (through 1d), reference is now made to FIG. 5. There it can be seen that sensor element 1a has, on its side facing the external environment, an (active) electrode element 11. Electrode element 11, made thin or flat, can be electrically switched either as transmit electrode or as receive electrode. For this purpose, electrode element 11 is capable of being connected to a different voltage potential. On the side facing away from the external environment, a first bearer or intermediate element 12 is connected to electrode element 11. On the side of intermediate element 12 facing away from electrode element 11, there is situated a shielding electrode 13 that is connected to electrical ground at least at the time of measurement. A second intermediate layer 14 is connected to shielding electrode 13. To second intermediate layer 14 there is connected a first signal layer 15 to which in turn a third intermediate layer 16 is connected. On the side of third intermediate layer 16 facing away from first signal layer 15, there is connected a second signal layer 17 on which electronic components 18 are situated.

With reference to FIGS. 1 through 4, a possible mode of operation of sensor system 100 is explained as follows: first, corresponding to FIG. 1, sensor element 1a is switched as transmit electrode, while adjacent sensor elements 1b through 1d are each switched as, or act as, receive electrode. In this way, three electrical (alternating) fields 21 through 23 are simultaneously formed, shown in FIG. 1 by a respective single field line as an example. First electrical field 21 is formed between sensor element 1a and sensor element 1b. Second electrical field 22 is formed between sensor element 1a and sensor element 1c. Third electrical field 23 is formed between sensor element 1a and sensor element 1d. All three electrical fields 21 through 23 can be monitored by an evaluation device (not shown in FIGS. 1 through 4) in order for example to recognize the approach of a hand H to electrical fields 21 through 23.

Figure 2:
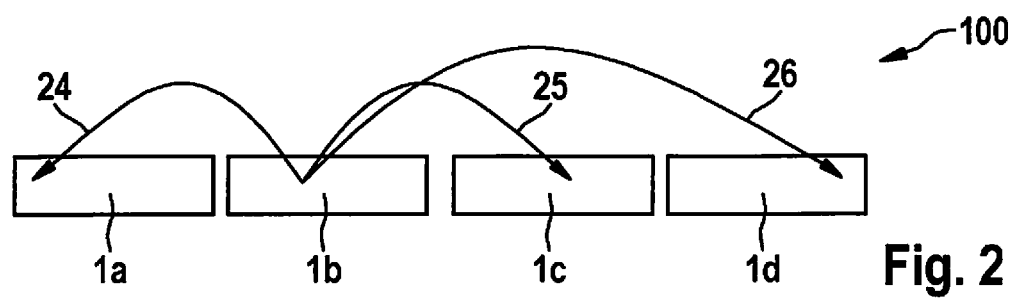

After the formation of electrical fields 21 through 23, subsequently three further electrical fields 24 through 26 are formed according to FIG. 2. Electrical fields 24 through 26 are formed in that sensor element 1*b* is now operated as transmit electrode, while sensor elements 1*a*, 1*c*, and 1*d* act as receive electrode.

Figure 3:
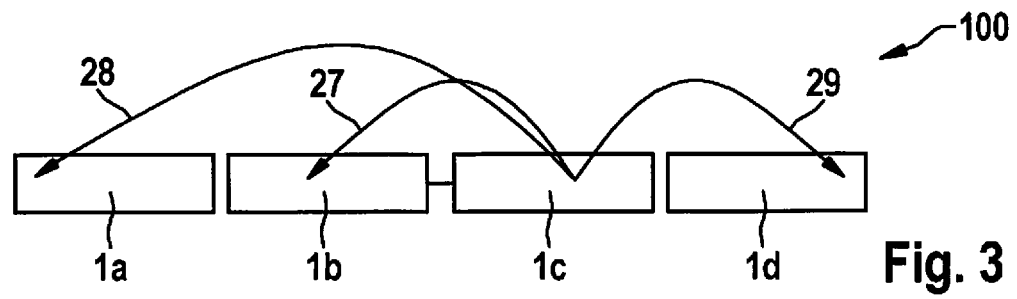

Subsequently, according to FIG. 3, three electrical fields 27 through 29 are in turn formed. Here, sensor element 1*c* is operated as transmit electrode, while sensor elements 1*a*, 1*b*, and 1*d* act as receive electrode.

Figure 4:
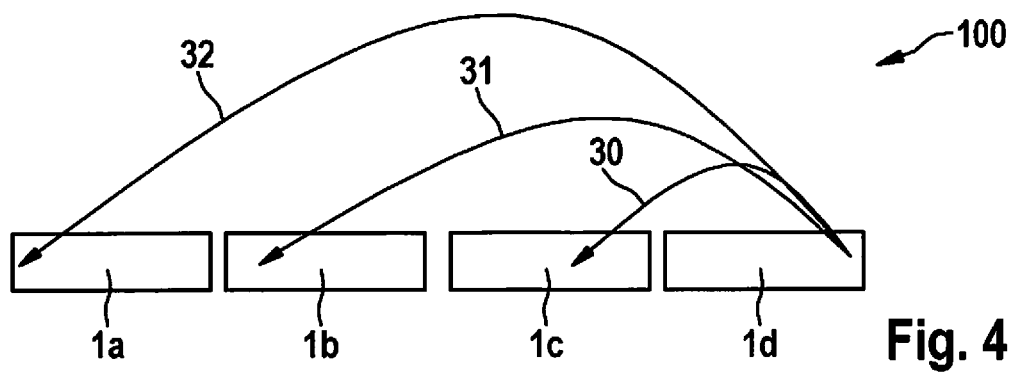

Finally, corresponding to FIG. 4, three electrical fields 30 through 32 are produced, sensor elements 1*a*, 1*b*, and 1*c* acting as receive electrode, while sensor element 1*d* acts as transmit electrode.

Figure 6:
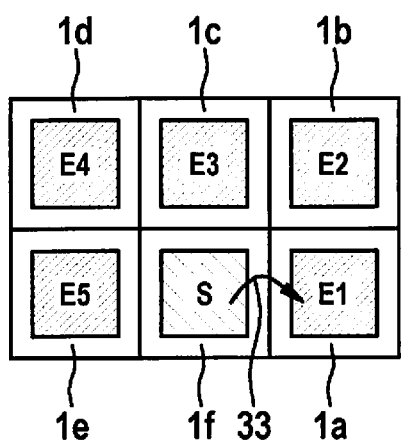
FIG. 6 and FIG. 7 show simplified representations showing the formation of electrical fields during two temporally successive cycles.
Figure 7:
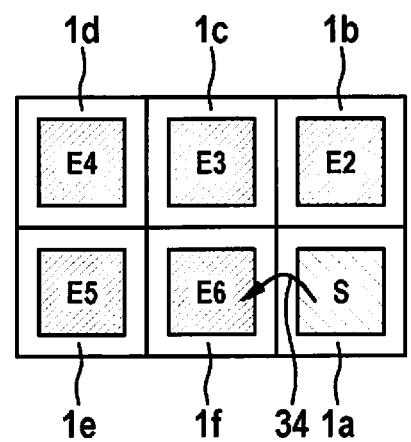

Subsequently, electrical fields 21 through 32 can again be formed corresponding to the sequence of FIGS. 1 through 4, or in a reverse sequence, or, alternatively, in any sequence. FIGS. 6 and 7 show a further operating mode of sensor system 100, using six sensor elements 1*a* through 1*f*. In order to illustrate which of sensor elements 1*a* through 1*f* acts as transmit electrode or as receive electrode, sensor elements 1*a* through 1*f* are designated E1 through E6, while a sensor element acting as transmit electrode is designated S.

On the basis of FIG. 6, it can be seen that at a first time sensor element 1*f* acts as transmit electrode S, while adjacent sensor element 1*a* acts as receive electrode E1. Between the two sensor elements 1*a* and 1*f* an electrical field 33 is formed. Subsequently, corresponding to FIG. 7, the functioning of the two sensor elements 1*a* and 1*f* is reversed in such a way that now sensor element 1*a* acts as transmit electrode S, while sensor element 1*f* acts as receive electrode E6. Here, an electrical field 34 is formed between the two sensor elements 1*a* and 1*f*.

Figure 8:
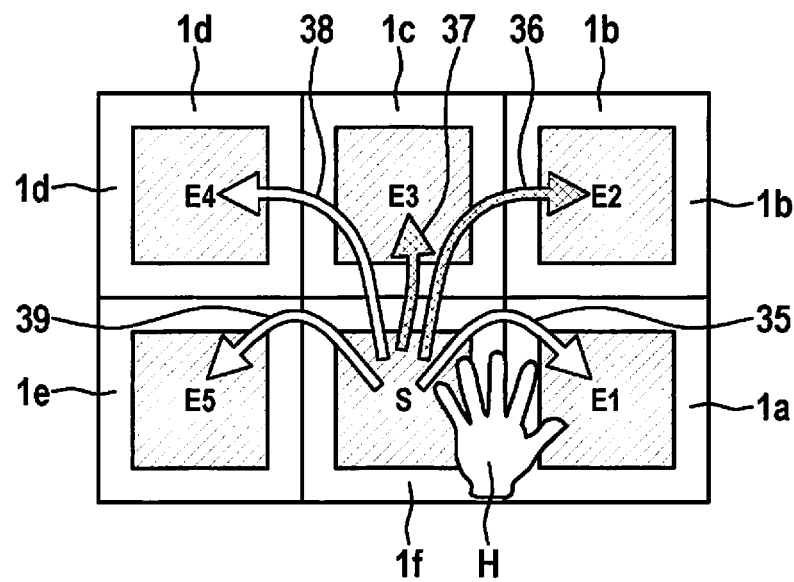
FIG. 8 shows a representation of a sensor system in which dead zones formed between sensor elements can be recognized.

FIG. 8 shows how, given the use of six sensor elements 1*a* through 1*f*, an object, in the form of a hand H, that is approaching between the two sensor elements 1*a* and 1*f* is recognized. Here it is essential that, as hand H approaches from a direction in which an electrical field 35 formed between sensor elements 1*a* and 1*f* is not changed, the approach of hand H to sensor system 100 is recognized through a change of electrical fields 36 and 37 between sensor elements 1*f* and 1*b*, as well as 1*f* and 1*c*. The two electrical fields 38 and 39 between sensor element 1*f* and sensor element 1*d*, or sensor element 1*e*, for example do not change when hand H approaches sensor system 100.

Figure 9:
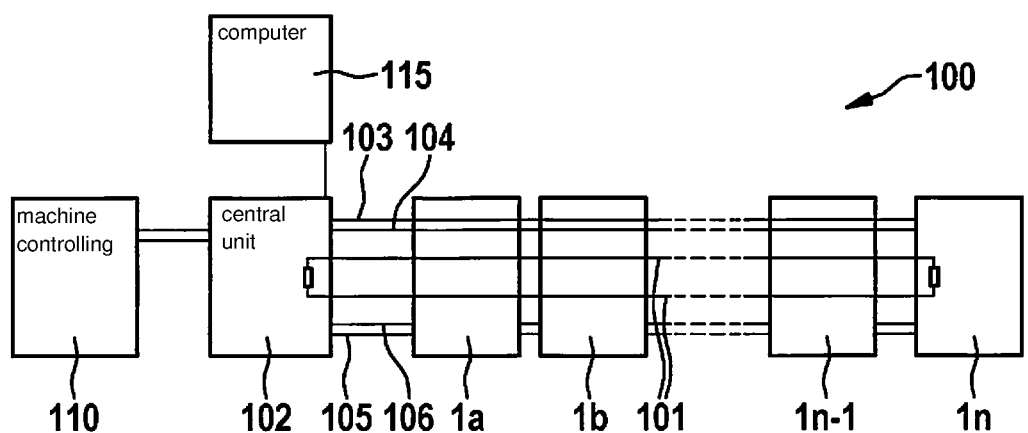
FIG. 9 shows a simplified schematic diagram of a sensor system according to the present invention as part of a machine controlling.

FIG. 9 further explains the design or configuration of sensor system 100. In particular, it can be seen that a multiplicity of sensor elements 1*a* through 1*n* are connected or coupled in the form of a chain, via a common bus line 101, to a central unit 102 acting as control device. The supply of voltage to individual sensor elements 1*a* through 1*n* also takes place via central unit 102, via connecting lines 103, 104. In addition, serial connections 105, 106 for data exchange are respectively present both between the individual sensor elements 1*a* through 1*n* and between sensor element 1*a* and central unit 102. Central unit 102 is connected to a machine controlling 110 that operates or puts the machine for example into a safe mode when there is an approach of an object or a person. In addition, central unit 102 can be configured via a computer 115.

In addition, it is to be noted that the recognition of the approach of an object or a person to sensor elements 1*a* through 1*f* can be realized by an analog, digital, or mixed analog/digital circuit. In addition, it is to be noted that, in contrast to FIG. 5, sensor elements 1*a* through 1*f* can also be fashioned or realized in that either, as shown in FIG. 5, each electrode 11 has assigned to it a separate sensor element 1*a* through 1*f*, or a separate substrate, or else a plurality of electrodes 11 of sensor elements 1*a* through 1*f* are situated on a common substrate.

The layer construction of a sensor element 1*a* through 1*f* can also differ from the design shown in FIG. 5. Thus, for example it can be possible to provide no further electrode elements alongside active electrode element 11. It is also for example possible for a bias electrode to be situated or connected between electrode element 11 and shielding electrode 13. In addition, it can be provided that an electrode element 11 is fashioned only as transmit electrode or receive electrode. In addition, it can be provided to situate sensor system 100 described above, or sensor elements 1*a* through 1*f*, in for example (plastic) casing shells of an industrial robot or a machine. The electronic components can be situated on the same substrate as the electrode elements, or at least some of the components can be situated on a constructively separate circuit bearer.

A further acceleration of the measurement process can be achieved in that one or more sensor elements 1*a* through 1*n*, acting as transmit electrodes, are simultaneously operated with different transmit frequencies, and that the different transmit frequencies are simultaneously acquired by sensor elements 1*a* through 1*n*, acting as receive electrodes, for example using filters.

With regard to the evaluation method of electrical fields 21 through 38, it is to be noted that a comparison of the change in measurement value of each electrical field 21 through 38, or characteristic values calculated therefrom, with an upper or lower boundary value can be carried out for each electrical field 21 through 38, and machine controlling 110 can be put into a safe state when such a boundary value is exceeded or fallen below. A dynamic approach of an object or person can also be inferred if the change in a measurement value of an electrical field 21 through 38 takes place faster than a specified boundary value. By including the measurement values of adjacent sensor elements 1*a* through 1*n* and processing them using suitable algorithms in order to plausibilize the measurement values, or in order to in the case of sensor elements 1*a* through 1*n* that do not stand in a fixed spatial relation to one another, a reliable recognition of safety-critical approaches is enabled.

With regard to possible applications, in addition to use in industrial plants or industrial robots, it is to be noted that such a sensor system 100 can for example also be installed in a chassis part of a motor vehicle, such as a fender, in order in this way for example to perform an assistance and safety function.

Sensor system 100 described above can be modified in many ways without departing from the present invention.

What is claimed is:

1. A method for operating a sensor system having at least three capacitive sensor elements that can be attached on the surface of a machine or a component, the method comprising:
    performing one of:
        forming simultaneously at least two electrical fields between a first capacitive sensor element acting as a transmit electrode, and two second capacitive sensor elements acting as receive electrodes; or
        forming simultaneously the at least formed electrical fields between a second capacitive sensor element acting as a receive electrode and two first capacitive sensor elements acting as transmit electrodes;

wherein the capacitive sensor elements have electrodes for forming the electrical fields between the electrodes having different electrical potentials, the electrical fields changing upon approach and/or upon contact of a body or an object, the electrodes acting as the transmit electrodes and/or as the receive electrodes, and the capacitive sensor elements being controlled successively by a control device in a determined temporal or positional sequence, and wherein the capacitive sensor elements are connected or coupled in the form of a chain to a central unit acting as control device, wherein a supply of voltage to individual ones of the capacitive sensor elements takes place via the central unit via connecting lines, and wherein the central unit is connected to a machine controller that puts the machine or component into a safe mode when there is an approach of the body or the object.

2. The method as recited in claim 1, wherein all capacitive sensor elements not acting as a transmit electrode are simultaneously switched as to act as a receive electrode.

3. The method as recited in claim 1, wherein at least two of the capacitive sensor elements situated immediately adjacent to one another are switched to act as a transmit electrode in temporal succession, and the respective capacitive sensor element of the at least two of the capacitive sensor elements previously acting as a transmit electrode is switched to act as a receive electrode.

4. The method as recited in claim 1, further comprising:
comparing, using an algorithm, measurement signals from electrical fields situated spatially close to one another with measurement signals of electrical fields situated spatially far from one another.

5. The method as recited in claim 1, wherein at least one of: (i) a plurality of the capacitive sensor elements acting as receive electrodes are electrically connected together, and (ii) a plurality of the capacitive sensor elements acting as a transmit electrode are electrically connected together.

6. The method as recited in claim 1, wherein an electrical field formed between two capacitive sensor elements is first produced by operating a first capacitive sensor element as a transmit electrode and a second capacitive sensor element as a receive electrode, and the electrical field is next produced by operating the second capacitive sensor element as a transmit electrode and the first capacitive sensor element as a receive electrode.

7. The method as recited in claim 1, wherein, some electrical fields are formed simultaneously and other electrical fields are formed in temporal succession.

8. The method as recited in claim 1, wherein the capacitive sensor elements acting as a transmit electrode are operated with different frequencies.

9. The method as recited in claim 8, wherein at least one of the capacitive sensor elements is electrically switchable to act as a receive electrode, and the at least one capacitive sensor element acting as a receive electrode is configured to distinguish the different frequencies using filters.

10. A sensor element for use with a sensor system, comprising:
a single electrode for forming a part of an electrical field, wherein the single electrode connectable to a different electrical potential so that the single electrode is electrically switchable to be operable as a receive electrode or as a transmit electrode, wherein the sensor element is a capacitive sensor element;

wherein the sensor system, includes:
a plurality of the capacitive sensor elements, wherein each of the capacitive sensor elements include a single electrode for forming a part of an electrical field, wherein the single electrode is connectable to a different electrical potential so that the single electrode operate as a receive electrode and operate as a transmit electrode, and wherein the capacitive sensor elements are controllable by a common control device via a bus system;

wherein the capacitive sensor elements have electrodes for forming the electrical fields between the electrodes having different electrical potentials, the electrical fields changing upon approach and/or upon contact of a body or an object, the electrodes acting as the transmit electrodes and/or as the receive electrodes, and the capacitive sensor elements being controlled successively by a control device in a determined temporal or positional sequence, and wherein the capacitive sensor elements are connected or coupled in the form of a chain to a central unit acting as control device, wherein a supply of voltage to individual ones of the capacitive sensor elements takes place via the central unit via connecting lines, and wherein the central unit is connected to a machine controller that puts the machine or component into a safe mode when there is an approach of the body or the object.

11. A sensor system, comprising:
a plurality of capacitive sensor elements, wherein each of the capacitive sensor elements include a single electrode for forming a part of an electrical field, wherein the single electrode is connectable to a different electrical potential so that the single electrode operate as a receive electrode and operate as a transmit electrode, and wherein the capacitive sensor elements are controllable by a common control device via a bus system;

wherein the capacitive sensor elements have electrodes for forming the electrical fields between the electrodes having different electrical potentials, the electrical fields changing upon approach and/or upon contact of a body or an object, the electrodes acting as the transmit electrodes and/or as the receive electrodes, and the capacitive sensor elements being controlled successively by a control device in a determined temporal or positional sequence, and wherein the capacitive sensor elements are connected or coupled in the form of a chain to a central unit acting as control device, wherein a supply of voltage to individual ones of the capacitive sensor elements takes place via the central unit via connecting lines, and wherein the central unit is connected to a machine controller that puts the machine or component into a safe mode when there is an approach of the body or the object.

12. The sensor system as recited in claim 11, wherein the sensor system is part of a machine controller for recognizing an approach of objects or bodies.

* * * * *